(12) United States Patent
Yanagisawa

(10) Patent No.: US 6,555,755 B1
(45) Date of Patent: Apr. 29, 2003

(54) FLEXIBLE INTERCONNECTING SUBSTRATE AND METHOD OF MANUFACTURING THE SAME, FILM CARRIER, TAPE-SHAPED SEMICONDUCTOR DEVICE, SEMICONDUCTOR DEVICE, CIRCUIT BOARD, AND ELECTRONIC EQUIPMENT

(75) Inventor: Masahiko Yanagisawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/492,383

(22) Filed: Jan. 27, 2000

(30) Foreign Application Priority Data

Jan. 26, 1999 (JP) .......................................... 11-017128
Dec. 28, 1999 (JP) .......................................... 11-372909

(51) Int. Cl.⁷ ................................................. H05K 1/00
(52) U.S. Cl. ........................ 174/254; 174/261; 174/255; 29/846
(58) Field of Search ......................... 174/254, 255, 174/260, 268, 19, 250, 261; 361/749, 776; 29/846–854

(56) References Cited

U.S. PATENT DOCUMENTS

| | | | | |
|---|---|---|---|---|
| 5,305,130 A | * | 4/1994 | Yamawaki | 359/88 |
| 5,568,363 A | * | 10/1996 | Kitahara | 361/773 |
| 5,686,757 A | * | 11/1997 | Urushima | 257/668 |
| 6,157,541 A | * | 2/2000 | Hacke | 361/749 |

FOREIGN PATENT DOCUMENTS

| | | |
|---|---|---|
| JP | U-4-93147 | 8/1992 |
| JP | 8-186154 | 7/1996 |
| JP | 9-321083 | 12/1997 |

* cited by examiner

Primary Examiner—Albert W. Paladini
Assistant Examiner—Jeremy Norris
(74) Attorney, Agent, or Firm—Oliff & Berridge, PLC

(57) ABSTRACT

A flexible interconnecting substrate comprises a base substrate of an elongate form and interconnecting patterns formed on the base substrate, where each of the interconnecting patterns has a plurality of interconnects and each of the interconnects has a portion that extends to the right and a portion that extends to the left, with respect to the longitudinal axis of the base substrate. Each interconnecting pattern has narrow portions and that narrow in the widthwise direction of the base substrate and wide portions and that broaden in the widthwise direction of the base substrate.

28 Claims, 6 Drawing Sheets

FLEXIBLE INTERCONNECTING SUBSTRATE AND METHOD OF MANUFACTURING THE SAME, FILM CARRIER, TAPE-SHAPED SEMICONDUCTOR DEVICE, SEMICONDUCTOR DEVICE, CIRCUIT BOARD, AND ELECTRONIC EQUIPMENT

BACKGROUND OF THE INVENTION

1. Field of the Invention

The present invention relates to a flexible interconnecting substrate and a method of fabrication thereof, a film carrier, a tape-shaped semiconductor device, a semiconductor device, a circuit board, together with electronic equipment.

2. Description of the Related Art

Tape automated bonding (TAB) is known in the art for mounting semiconductor chips onto a flexible interconnecting substrate. This flexible interconnecting substrate often comprises a flexible base substrate of a polyimide and an interconnecting pattern formed by machining a foil copper material on top thereof. Warping is likely to occur in a prior-art flexible interconnecting substrate, due to heating that is applied during heating steps partway through the fabrication. If the base substrate becomes bent, a problem will occur in that the reliability of connections with semiconductor chips or mounting substrates will deteriorate.

SUMMARY OF THE INVENTION

The present invention was devised to solve these problems and has as an objective thereof the provision of a flexible interconnecting substrate and a method of manufacturing the same, a film carrier, a tape-shaped semiconductor device, a semiconductor device, a circuit board, and electronic equipment that make it possible to reduce warping of a base substrate.

(1) A flexible interconnecting substrate in accordance with the present invention comprises a tape-shaped base substrate and a plurality of interconnecting patterns formed on the base substrate, wherein:
   each of the interconnecting patterns has a plurality of interconnects, and
   each of interconnects has a portion extending in a direction of a first side edge of a widthwise direction of the base substrate, and a portion extending in a direction of a second side edge of the widthwise direction of the base substrate, the directions of the first and second side-edges crossing with a longitudinal axis of the base substrate.

Note that in this aspect of the invention, "interconnect" indicates a portion in contact with at least two electrical contact points and "interconnecting pattern" indicates all of a plurality of interconnects comprised within one final product (such as a semiconductor device). A flexible interconnecting substrate in accordance with the present invention comprises a plurality of interconnecting patterns for manufacturing a plurality of final products.

With this aspect of the invention, interconnects have portions that extend in the directions of first and second side edges, so that the interconnects provide support in a plurality of directions even if the base substrate expands or contracts, thus making it possible to reduce warping of the base substrate.

(2) With the above described flexible interconnecting substrate,
   each of the interconnecting patterns may have a plurality of interconnect portions aligned along an extending direction of the interconnecting patterns, the interconnecting portions comprising regions of plurality types of width being disposed on the base substrate.

This ensures a configuration in which the interconnecting pattern goes obliquely with respect to the direction of extension of the interconnecting pattern, within the region between the interconnecting portions having different width of disposed region. The strength of the material that forms the interconnecting pattern can therefore be increased in directions other than the direction of extension of the interconnecting pattern, and also the bending strength of the base substrate can also be increased. As a result, it is possible to prevent the generation of warping in the base substrate because the interconnecting pattern provides support even when a force that causes warping is applied to the base substrate. Since the interconnecting pattern goes obliquely with respect to the extending direction of the interconnecting pattern, even when the material of the interconnecting pattern and the material of the base substrate have different coefficients of thermal expansion, stress is applied in a direction that the base substrate is difficult to be warped. It is therefore possible to reduce the amount of warping generated in the base substrate.

(3) With the above described flexible interconnecting substrate,
   each of the interconnecting patterns may have a plurality of interconnect portions aligned along a longitudinal direction of the base substrate, the interconnecting portions comprising regions of plurality types of width being disposed on the base substrate.

This ensures a configuration in which the interconnecting pattern goes obliquely with respect to the longitudinal direction of the base substrate, within the region between the interconnecting portions having different width of disposed region.

The strength of the material that forms the interconnecting pattern can therefore be increased in directions other than the longitudinal direction of the base substrate, and also the bending strength of the base substrate itself can also be increased. As a result, it is possible to prevent the generation of warping in the base substrate because the interconnecting pattern provides support even when a force that causes warping is applied to the base substrate. Since the interconnecting pattern goes obliquely with respect to the longitudinal direction of the base substrate, even when the material of the interconnecting pattern and the material of the base substrate have different coefficients of thermal expansion, stress is applied in a direction that the base substrate is difficult to be warped. It is therefore possible to reduce the amount of warping generated in the base substrate.

(4) With the above described flexible interconnecting substrate,
   one of the interconnect portions may be a wide portion that expands the width of a region disposed on the base substrate between the first and second side edges, and
   another of the interconnect portions may be a narrow portion that narrows the width of the region disposed on the base substrate between the first and second side edges.

(5) With the above described flexible interconnecting substrate,
   the wide portion may be a maximum of the width of the region disposed on the base substrate, and
   the narrow portion may make the width of the region disposed on the base substrate narrower than the width of the wide portion.

(6) With the above described flexible interconnecting substrate,
the narrow portion may have a plurality of direction-changing portions for changing the direction of each of the interconnecting patterns.

(7) With the above described flexible interconnecting substrate,
the width of a portion of each of the interconnects positioned at the wide portion may be wider than the width of a portion thereof positioned at the narrow portion.

This makes it possible to vary the pitch of interconnects, utilizing a configuration for preventing warping of the base substrate.

(8) With the above described flexible interconnecting substrate,
a pitch of the interconnects adjoining each other at the wide portions may be wider than the pitch thereof at the narrow portions.

This makes it possible to vary the pitch of interconnects, utilizing a configuration for preventing warping of the base substrate.

(9) With the above described flexible interconnecting substrate,
a slit may be formed in the base substrate so as to extend in the widthwise direction thereof.

This configuration ensures that the formation of a slit makes it easy to bend the base substrate.

(10) With the above described flexible interconnecting substrate,
the slit may be formed in a region where the wide portion is formed.

This configuration ensures that the slit is formed in a region where a wider portion of the interconnect is formed, in other words, where a portion of the interconnect that is stronger is formed. Therefore, forming the slit ensures that breakages are prevented by the increased strength of the interconnect itself, even if the strength of the base substrate or the strength that supports the interconnect should decrease.

(11) With the above described flexible interconnecting substrate,
each of the interconnecting patterns may have an electrically connecting portion to a semiconductor chip, and may be formed in regions extending in a plurality of directions from the electrically connecting portion,
the narrow portion and the wide portion being formed in at least one of the regions.

In other words, each of the interconnecting patterns is formed to extend in two directions from the electrically connecting portion as the center. The narrow portion and the wide portion of the interconnecting pattern are formed within at least one of the extending regions.

(12) With the above described flexible interconnecting substrate,
each of the interconnecting patterns may have a first terminal for external connection that is formed in a region extending in one direction from the electrically connecting portion and a second terminal for external connection that is formed in a region extending in another direction from the electrically connecting portion, and
the narrow portion and the wide portion may be formed between the electrically connecting portion and at least one of the first and second terminals.

The provision of the narrow portion and the wide portion for removing warping of the base substrate prevents at least one position of the first and second terminals from being wrongly positioned.

(13) With the above described flexible interconnecting substrate,
a plurality of device holes may be formed in the base substrate, and
the electrically connecting portion may comprise a plurality of leads protruding into each of the device holes.

(14) The above-described flexible interconnecting substrate may comprise a protective film covering the interconnecting patterns,
wherein the width of the protective film in the widthwise direction of the base substrate may be formed to be wider in a region covering the wide portion and narrower in a region covering the narrow portion.

This makes it possible to form the protective film to be narrow in a region that covers the narrow portion, restraining the effects of expansion and contraction of the protective film with respect to the base substrate. In other words, the region in which the protective film is formed is reduced, making it possible to restrain the amount of thermal contraction of the protective film, even when the flexible interconnecting substrate is subjected to a heating step, and thus making it possible to reduce the amount of warping of the base substrate.

(15) With the above described flexible interconnecting substrate,
each of the interconnects may extend by repeating a reciprocal bend to the left and the right.

(16) A film carrier in accordance with the present invention could be obtained by cutting the base substrate of the flexible interconnecting substrate described above, at lines extending in the widthwise direction of the base substrate.

(17) A tape-shaped semiconductor device in accordance with the present invention comprises:
the above described flexible interconnecting substrate; and
a plurality of semiconductor chips connected electrically to the interconnecting pattern of the flexible interconnecting substrate.

(18) A semiconductor device in accordance with the present invention is obtained by cutting the base substrate of the tape-shaped semiconductor device at lines extending in the widthwise direction, on both sides of one of the semiconductor chips.

Such a semiconductor device is not limited to one obtained by cutting the base substrate of the above described tape-shaped semiconductor device, it can also apply to any semiconductor device having a similar configuration and form to one obtained by cutting.

(19) A semiconductor device as another aspect of the present invention is obtained by punching-out the base substrate of the tape-shaped semiconductor device around an outline that encompasses one of the semiconductor chips.

Such a semiconductor device is not limited to one obtained by punching out the base substrate of the above described tape-shaped semiconductor device; it can also apply to any semiconductor device having a similar configuration and form to one obtained by punching.

(20) A circuit board in accordance with the present invention is connected electrically to the above described semiconductor device.

(21) With the above described circuit board,
the base substrate of the semiconductor device may be provided so as to bend around an edge of the circuit board.

(22) With the above described circuit board,
the base substrate of the semiconductor device may be provided with the slit described above,
the slit of the base substrate may be disposed at the edge of the circuit board, and
a portion of the base substrate forming the slit, may bend.

(23) The above-described circuit board could be formed as a liquid crystal panel.

(24) Electronic equipment in accordance with the present invention has a semiconductor device.

(25) A method of manufacturing a flexible interconnecting substrate in accordance with the present invention comprises a step of forming a plurality of interconnecting patterns on a base substrate of an elongate form, wherein:
each of the interconnecting patterns has a plurality of interconnects, and
a portion of each of interconnects is formed to extend in a direction of a first side edge of a widthwise direction of the base substrate, and another portion of the interconnects is formed to extend in a direction of a second side edge of the widthwise direction of the base substrate, the directions of the first and second side-edges crossing with a longitudinal axis of the base substrate.

Note that in this aspect of the invention, "interconnect" indicates a portion in contact with at least two electrical contact points and "interconnecting pattern" indicates all of a plurality of interconnects comprised within one final product (such as a semiconductor device). A flexible interconnecting substrate in accordance with the present invention comprises a plurality of interconnecting patterns for manufacturing a plurality of final products.

With this aspect of the invention, interconnects have portions that extend to the right and left, so that the interconnects provide support in a plurality of directions even if the base substrate expands or contracts, thus making it possible to reduce warming of the base substrate.

DETAILED DESCRIPTION OF THE PREFFERED EMBODIMENT

Preferred embodiments to which the present invention are applied will be described below with reference to the accompanying figures.

Flexible Interconnecting Substrate

Figure 1:
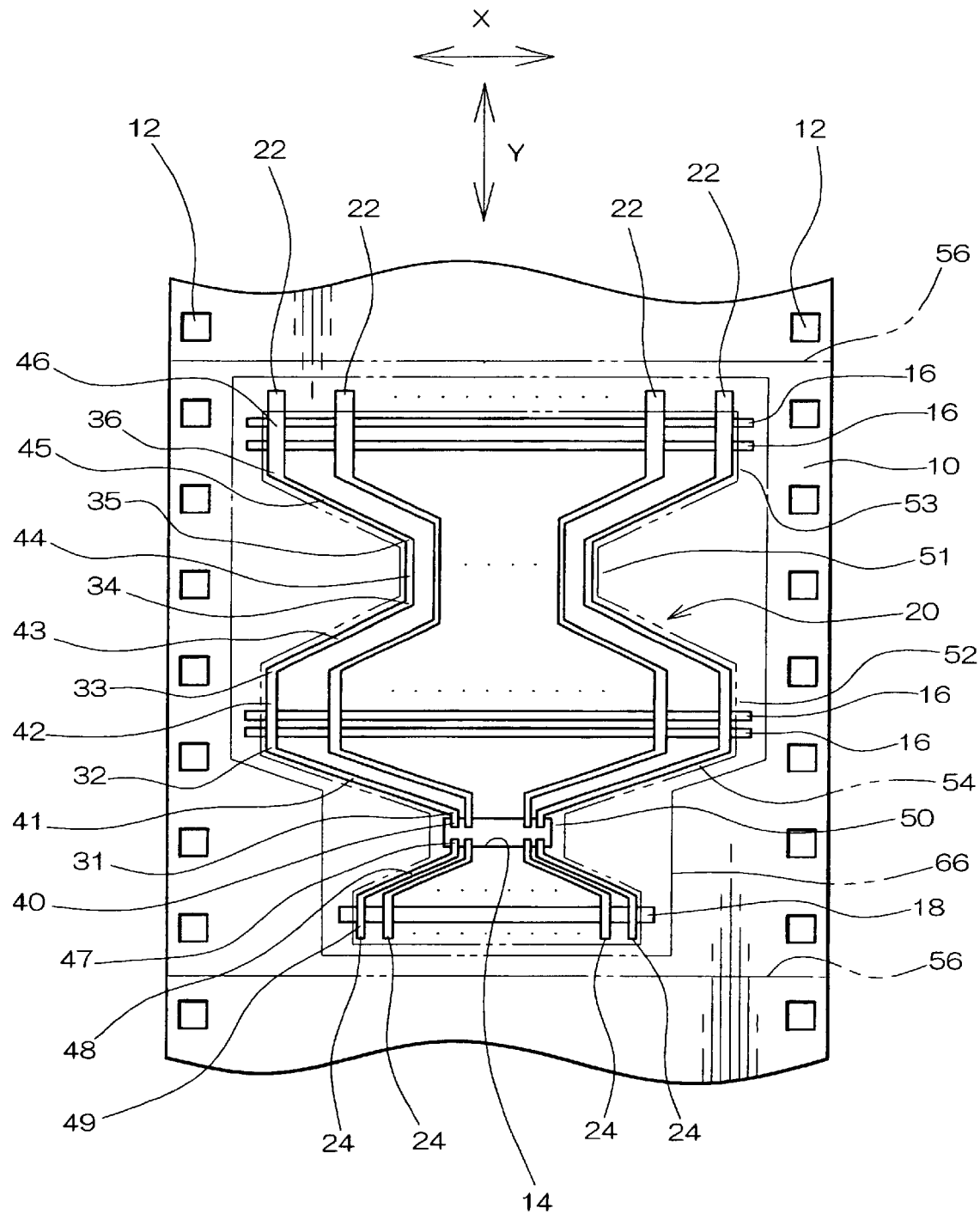
FIG. 1 shows a flexible interconnecting substrate in accordance with an embodiment to which the present invention is applied.
Figure 2:
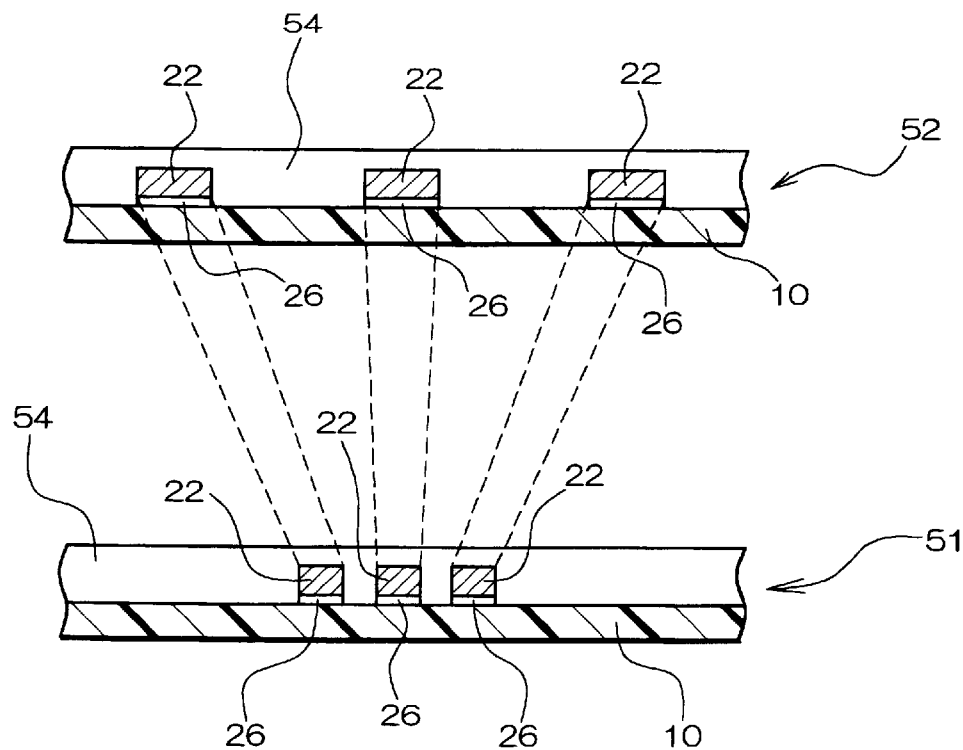
FIG. 2 is a cross-sectional view of the flexible interconnecting substrate in accordance with this-embodiment of the invention.
Figure 3:
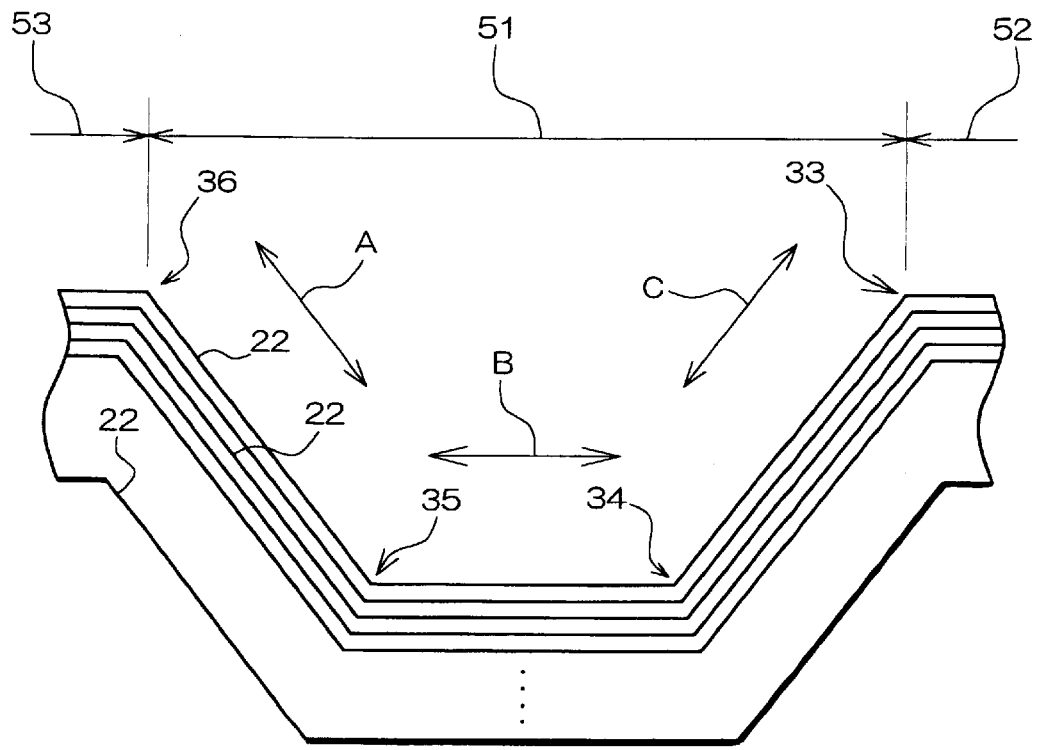
FIG. 3 is a partial expanded view of the flexible interconnect substrate in accordance with this embodiment of the invention.

A flexible interconnecting substrate in accordance with an embodiment of the present invention is shown in FIGS. 1 to 3.

This flexible interconnecting substrate comprises a base substrate 10 and a plurality of interconnecting patterns 20. The flexible interconnecting substrate can be handled by being wound onto a real, which is not shown in the figures. If the TAB technique is to be applied, the flexible interconnecting substrate is a substrate for TAB (a film carrier tape), but it is not limited thereto and thus could equally well be a substrate for chip-on-film (COF) packaging or a substrate for chip-on-board (COB) packaging.

The base substrate 10 is a base material of an elongate form (tape-shaped) that acts as a support member for the interconnecting patterns 20. The base substrate 10 has flexibility. The base substrate 10 is frequently formed of a polyimide resin, but other known materials can be used therefor. If a plurality of sprocket holes 12 are formed in the lengthwise direction that is rotated through 90 degrees with respect to the widthwise direction of the base substrate 10 (in other words, in the direction perpendicular thereto) along both sides of the base substrate 10 in the widthwise direction (the X direction in FIG. 1), the flexible interconnecting substrate can be moved out by sprockets (not shown in the figure).

If the TAB technique is to be used, one device hole 14 (or a plurality thereof overall) is formed in the interconnecting patterns 20 on the base substrate 10. Bonding between a semiconductor chip and inner leads can be done through this device hole 14. The shape of the device hole 14 is not particularly limited, so it could be of a size sufficient to completely accommodate the semiconductor chip, or of a size that accommodates only part thereof.

At least one slit 16 (or a plurality thereof, in FIG. 1) could be formed in the base substrate 10. Each slit 16 could be a notch or an elongated hole, and it could be formed to have either a linear shape or a curved shape. The formation of these slits 16 makes it easy to bend the base substrate 10. Specifically, the portion of the base substrate 10 forming the slit 16 bends at the both ends of the slit 16. If the slit 16 is formed to extend in the widthwise direction of the base substrate 10, the base substrate 10 bends easily along a line in the widthwise direction thereof. The slit 16 is not formed as far as an inner side of an outline that will be punched-out to form the final product. In other words, the punch-out outline of the base substrate 10 and the slit 16 do not intersect. This ensures that the slit 16 is preserved even when the base substrate 10 has been punched out.

At least one outer lead hole 18 could be formed in the base substrate 10. Each outer lead hole 18 is formed to extend in the widthwise direction of the base substrate 10. Outer leads are formed to straddle the outer lead hole 18. This makes it possible to provide electrical contact with those outer leads from the surface that is opposite to the surface on which the outer leads are formed, through the outer lead hole 18.

A plurality of interconnecting patterns 20 are formed in the base substrate 10, with one thereof being shown in FIG. 1. With a flexible interconnecting substrate that has a three-layer substrate, the interconnecting patterns 20 are connected to the base substrate 10 by an adhesive 26 (see FIG. 2). With a flexible interconnecting substrate that has a two-layer substrate, the interconnecting patterns 20 are formed on the base substrate 10 with no adhesive therebetween.

The interconnecting patterns 20 could be formed aligned in the longitudinal direction of the elongated base substrate 10, or they could be formed in the widthwise direction thereof, or they could be formed in a matrix form (aligned in both the longitudinal direction and the widthwise direction). The interconnecting patterns 20 often have the same shape, but they can also be of different shapes. For example, an interconnecting pattern group that is configured of an array of n interconnecting patterns 20 of n different shapes could be formed repeatedly. To form a plurality of interconnecting patterns 20 by electroplating, plating leads (not shown in the figure) could be connected electrically thereto.

Each of the interconnecting patterns 20 has a plurality of interconnects 22 and 24. More specifically, a plurality of interconnects 22 is formed in the longitudinal direction of the base substrate 10 on a first side of the device hole 14 (the upper side in FIG. 1) and a plurality of interconnects 24 is formed on a second side thereof (the lower side in FIG. 1). A first end portion of each of the interconnects 22 and 24 acts as a lead (inner lead) and protrudes into the device hole 14.

A portion of a second end portion (a linear portion 46) of each of the interconnects 22 is supported by the base substrate 10 and forms an external terminal for external connections (a first terminal, such as an output terminal). A portion of a second end portion (a linear portion 49) of each of the interconnects 24 acts as an outer lead for external connections (a second terminal, such as an input terminal) and straddles the outer lead hole 18. Note that the presence or absence of the outer lead hole 18 could be set as appropriate. In addition, the interconnects 22 are formed to straddle the slits 16.

Each interconnect 22 has linear portions 40 and 46 at the ends thereof, where at least a portion of one linear portion 40 becomes an inner lead and at least a portion of the other linear portion 46 becomes an external terminal. Each of the linear portions 40 and 46 extends in the longitudinal direction of the base substrate 10 (along the longitudinal axis thereof)

Each of the interconnects 22 has a plurality of direction-changing portions 31 to 36 between the linear portions 40 and 46 thereof. Details will now be discussed, taking as an example the interconnect 22 that is positioned on the left-most side in FIG. 1. In the discussion below, the terms "to the left" and "to the right" refer to a direction of a first side edge and a direction of a second side edge that traverse the longitudinal axis of the base substrate 10.

The interconnect 22 bends to the left at the direction-changing portion 31 from the 40. The interconnect 22 has a linear portion (oblique portion) 41 that extends to the left in a linear form from the direction-changing portion 31. The interconnect 22 bends from the linear portion 41 at the direction-changing portion 32 into a direction along the longitudinal axis of the base substrate 10, and has a linear portion 42 along the longitudinal axis. The interconnect 22 bends to the right from the linear, portion 42 at the direction-changing portion 33 and has a linear portion (oblique portion) 43 that extends to the right. The interconnect 22 bends from the linear portion 43 at the direction-changing portion 33 into a direction along the longitudinal axis of the base substrate 10 and has a linear portion 44 along the, longitudinal axis. The interconnect 22 bends to the left from the linear portion 44 at the direction-changing portion 35 and has a linear portion (oblique portion) 45 that extends to the left. The interconnect 22 bends from the linear portion 45 at the direction-changing portion 36 into a direction along the longitudinal axis of the base substrate 10, and has the linear portion 46 (external terminal) along the longitudinal axis.

Note that the linear portions 40 to 46 could also bend or be in a zigzag form, or could be formed to have varying widths.

In this embodiment of the invention, each of the interconnects 22 has at least one (a plurality thereof in FIG. 1) linear portion 41 and 45 that extend to the left from the longitudinal axis of the base substrate 10 and at least one (only one in FIG. 1) linear portion 43 that extends to the right. Therefore, the base substrate 10 can be supported to the left and right by the linear portions 41 (45) and 43 that extend to the left or right. This means that deformation of the base substrate 10 due to thermally-induced expansion or the like can be restrained by the interconnects 22. Note that the material of the interconnects 22 (such as copper) has a lower coefficient of thermal expansion than the material of the base substrate 10 (such as polyimide resin).

The above discussion related to the interconnect 22 that is positioned at the left-most side in FIG. 1, but the other interconnects 22 have similar functions. It should be noted, however, that the interconnecting pattern 20 shown in FIG. 1 is formed to have lateral symmetry with respect to the center line in the longitudinal direction that passes through the center of the base substrate 10 in the widthwise direction. In this case, the interconnects 22 positioned on the right-hand side have a shape that is symmetrical with respect to the interconnects 22 positioned on the left-hand side. If the interconnecting pattern 20 is formed to have lateral symmetry in this manner, the linear portions 41, 43, and 45 that are inclined with respect to the axis of the base substrate 10 will also be inclined in directions that traverse with lateral symmetry. In this point too, making the interconnects 22 extend in different directions makes it possible to prevent warping and deformation of the base substrate 10.

The linear portions 40 to 46 of the plurality of interconnects 22 could be formed to be parallel. It should be noted, however, that if the interconnecting pattern 20 is formed to have lateral symmetry, the linear portions 41, 43, and 45 that extend laterally within the group of interconnects 22 positioned on the right-hand side are formed to be mutually parallel and the linear portions 41, 43, and 45 that extend laterally within the group of interconnects 22 positioned on the left-hand side are formed to be mutually parallel.

The interconnecting pattern 20 has a first interconnect, wherein the width of the region disposed on top of the base substrate 10 is a first width, and a second interconnect, wherein the width of the region disposed on top of the base substrate 10 is a second width. The first width could be set to a maximum, with the second width being narrower than the first width. In the example shown in FIG. 1, the first interconnect is a wide portion 52 (or 53) and the second interconnect is a narrow portion 50 (or 51). The description below concerns an example having the wide portion 52 (or 53) and the narrow portion 50 (or 51), but "first interconnect" could be substituted for the wide portion 52 (or 53) and "second interconnect" could be substituted for the narrow portion 50 (or 51).

In this embodiment of the invention, the interconnecting pattern 20 is formed to have lateral symmetry and has at least one (a plurality thereof in FIG. 1) of narrow portions 50 and 51 and at least one (a plurality thereof in FIG. 1) of wide portions 52 and 53. The wide portions 52 and 53 and the narrow portions 50 and 51 could be provided reciprocally along the direction of elongation of the interconnecting pattern 20, or provided along the longitudinal direction of the base substrate 10.

The narrow portion 50 is configured of the linear portions 40 that comprise the parts that will form inner leads. If the device hole 14 is small, it is formed in this manner. The linear portions 40 that configure the narrow portion 50 could be formed to be mutually parallel. The wide portion 52 is formed to extend from the narrow portion 50, with a first transition portion therebetween which expands in the widthwise direction of the base substrate 10. The first transition portion is configured of the plurality of linear portions 41. The linear portions 41 could be formed to be mutually parallel.

The wide portion 52 is configured of the plurality of linear portions 42. The linear portions 42 could be formed to be mutually parallel. The width of the linear portions 42 and the pitch between neighboring linear portions 42 could be made larger than those of the linear portions 40 of the narrow portion 50. Slits 16 could be formed in the region of the base substrate 10 that supports the wide portion 52, with the linear portions 42 straddling the slits 16. In such a case, increasing the width of the linear portions 42 can prevent breaking of the portions thereof that are not supported because of the formation of the slits 16.

The narrow portion 51 is formed to extend from the wide portion 52; with a second transition portion therebetween which contracts in the widthwise direction of the base substrate 10. The second transition portion is configured of the plurality of linear portions 43. The linear portions 43 that configure the second transition portion could be formed to be mutually parallel.

The narrow portion 51 is configured of the plurality of linear portions 44. The linear portions 44 could be formed to be mutually parallel.

The wide portion 53 is formed to extend from the narrow portion 51, with a third transition portion therebetween which expands in the widthwise direction of the base substrate 10. The third transition portion is configured of the plurality of linear portions 45. The linear portions 45 that configure the third transition portion could be formed to be mutually parallel.

The wide portion 53 is configured of the plurality of linear portions 46. The linear portions 46 could be formed to be mutually parallel. The width of the linear portions 46 and the pitch between neighboring linear portions 46 could be made larger than those of the linear portions 44 of the narrow portion 51. This would make it possible to form the linear portions 46 of a width that is suitable for use as external terminals. Slits 16 could be formed in the region of the base substrate 10 that supports the wide portion 53, with the linear portions 46 straddling the slits 16. In such a case, increasing the width of the linear portions 46 can prevent breaking of the portions thereof that are not supported because of the formation of the slits 16.

The interconnects 24 that were formed on the opposite side of the device hole 14 from the previously described interconnects 22 each have a linear portion 47 that comprises an inner lead, a linear portion 48 that spreads in the widthwise direction of the base substrate 10 from the 47, and the linear portion 49 that comprises a portion which will become an outer lead. At least one of the width and pitch of the linear portion 49 can be formed to be larger than that of the linear portion 47. Each of the interconnects 24 could be formed of portions that extend laterally, as described above, or as narrow portions and wide portions, as described above.

A protective film 54 (see FIG. 4) could be provided on top of the interconnecting pattern 20. The protective film 54 protects the interconnecting pattern 20 from oxidation or the like. The protective film 54 could be formed of a resin such as solder resist. The wide portion 53 is provided to cover the interconnecting pattern 20 except for those portions in electrical contact with other components such as, a semiconductor chip (such as the inner leads, external terminals, and outer leads). The region in which the protective film 54 is provided could be shaped to encompass the broken line indicated by reference numerals 54 in FIG. 1. This ensures that the width thereof in the lateral direction of the base substrate 10 is wider in regions that cover the wide portions 52 and 53 and narrower in regions that cover the narrow portions 50 and 51. This means that the region over which the protective film 54 is formed is smaller than if it is formed to the same width, which reduces the stresses that tend to cause deformation of the base substrate 10 due to contraction of the protective film 54.

The method of fabricating the above described flexible interconnecting substrate comprises a step of forming the plurality of interconnecting patterns 20 on the base substrate 10 of an elongate form. Each of the interconnecting patterns 20 has a plurality of interconnects 22, where a portion of each interconnect 22 is formed to extend to the right from the longitudinal axis of the base substrate 10 and another portion is formed to extend to the left from the longitudinal axis of the base substrate 10.

Film Carrier

In a film carrier in accordance with another embodiment to which the present invention is applied, the flexible interconnecting substrate of FIG. 1 is cut along lines in the widthwise direction (the broken lines indicated by reference numerals 56 in FIG. 1). For example, the film carrier is a piece of film cut from the above described flexible interconnecting substrate. Note that the positions at which the flexible interconnecting substrate is cut are not particularly limited. In the example shown in FIG. 1, both sides of one interconnecting pattern 20 act as cutting positions, but both sides of a plurality of interconnecting patterns 20 could equally well be used as cutting positions.

Tape-Shaped Semiconductor Device

Figure 4:
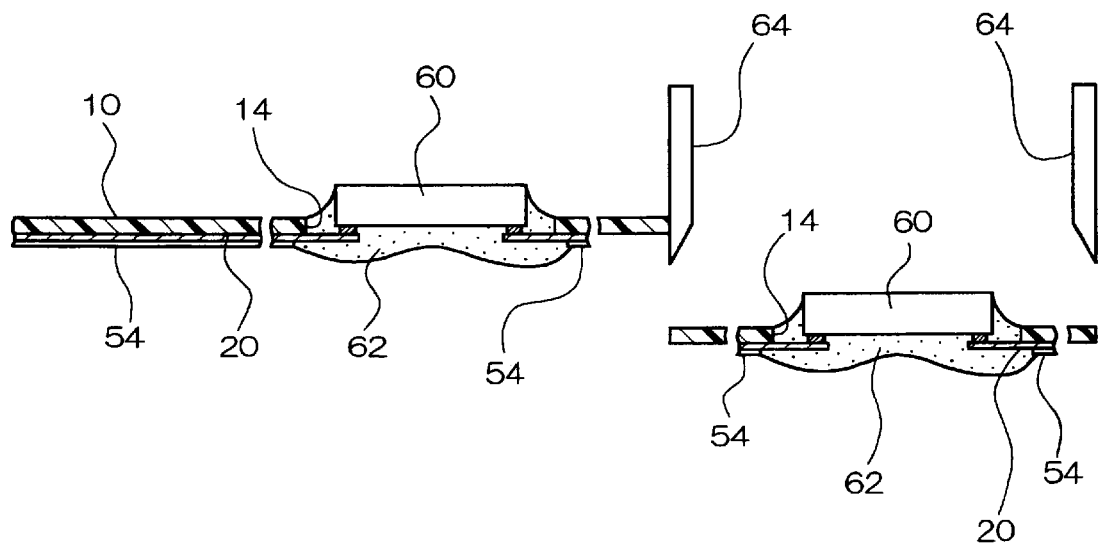
FIG. 4 shows a tape-shaped semiconductor device in accordance with an embodiment to which the present invention is applied.

A tape-shaped semiconductor device in accordance with a further embodiment to which the present invention is applied is shown in FIG. 4. This tape-shaped semiconductor device has the above described tape carrier and a plurality of semiconductor chips 60 that are connected electrically to the interconnecting patterns 20 thereof.

The planar shape of each semiconductor chip 60 is generally quadrangular, but it could be either rectangular or square. A plurality of electrodes is formed on one surface of each semiconductor chip 60. The electrodes are aligned along at least one edge (or two or four edges, if more than one) of the surface of the semiconductor chip. If the outer shape of each semiconductor chip 60 is rectangular, electrodes could be arrayed in the longer direction thereof, as in an IC for a liquid crystal drive by way of example, or they could be arrayed in the shorter direction thereof. In some cases, the electrodes may be arrayed at an end portion of the surface of each semiconductor chip 60, or they may be arrayed at a central portion thereof. The electrodes are often configured of pads that are formed thinly and flat of a material such as aluminum, with bumps formed on top thereof. If bumps are not formed, the pads alone become electrodes. A passivation film (not shown in the figure) is formed over the semiconductor chips, except for at least part of the electrodes. The passivation film can be formed of a material such as $SiO_2$, SiN, or polyimide resin, by way of example.

The electrodes of the semiconductor chips 60 could be bonded to the inner leads of the interconnecting patterns 20 through the device hole 14, by applying the TAB technique. Alternatively, face-down bonding of the semiconductor chips 60 could be employed, if a flexible interconnecting substrate with no device hole 14 is used. In such a case, the flexible interconnecting substrate could be a substrate wherein the active surface of the semiconductor chip 60 (the surface on which electrodes are formed) and the base substrate are on opposite sides, in other words, chip-on-film (COF) mounting.

Alternatively, if interconnect bonding or the like is to be employed, the semiconductor chip 60 could be bonded face-up. In such a case, the active surface of the semiconductor chip 60 (the surface on which electrodes are formed) is orientated in the same direction as the mounting surface of the base substrate of the flexible interconnecting substrate, for example, the electrodes of the semiconductor chip 60 could be connected to the interconnecting pattern 20 by interconnects (fine interconnects) of metal to give a face-up-mounted substrate.

Each semiconductor chip 60 is preferably sealed in by a sealing material 62 such as resin. The sealing material 62 seals in at least the electrically connecting portions between the semiconductor chip 60 and the interconnecting pattern 20. In addition, the end portions of the protective film 54 preferably overlap the sealing material 62 at each boundary between portions that are not covered by the protective film 54 and portions that are covered thereby, as shown in FIG. 4. This makes it possible to prevent exposure of the interconnecting pattern 20. The sealing material 62 could be provided by potting or it could be provided by a transfer mold.

Semiconductor Device

A semiconductor device in accordance with a still further embodiment to which the present invention is applied is formed, by cutting the tape-shaped semiconductor device of FIG. 4 along lines that extend in the widthwise direction. The tape-shaped semiconductor device could be cut on both sides of one interconnecting pattern 20, using cutting tools 64 (such as cutters or a punch), as shown in FIG. 4 by way of example. These cutting positions could be those indicated by the broken line 56 in FIG. 1.

The semiconductor device in accordance with this embodiment of the invention could be formed by punching out the base substrate 10 of the above-described tape-shaped semiconductor device. The position of the punching could be along the outline of one interconnecting pattern 20, as indicated by the broken line 66 in FIG. 1.

Semiconductor Device and Circuit Board

Figure 5:
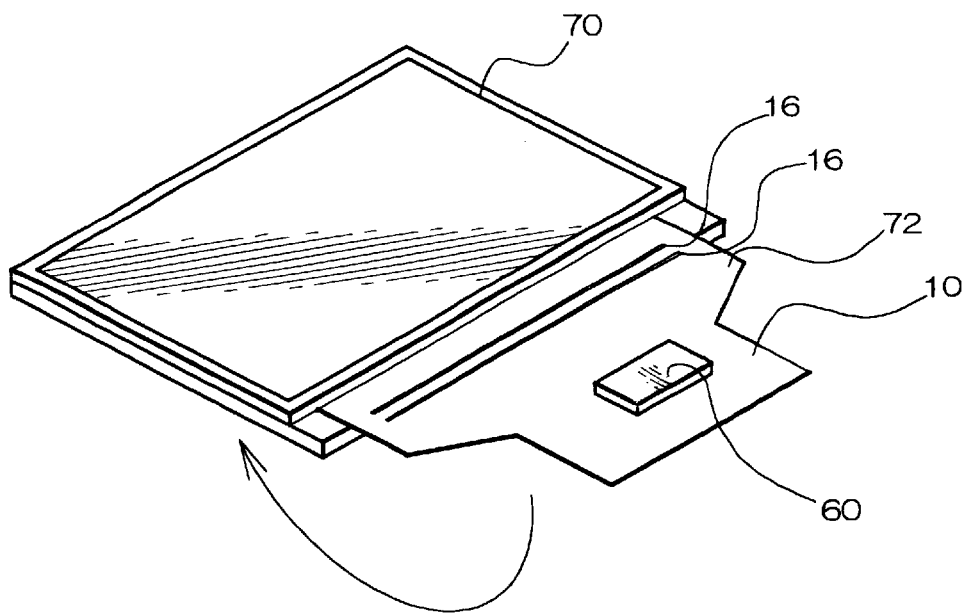
FIG. 5 shows a circuit board in accordance with an embodiment to which the present invention is applied.

A circuit board in accordance with yet another embodiment to which the present invention is applied is shown in FIG. 5. As shown in FIG. 5, a semiconductor device 72 as described above is connected electrically to the circuit board 70. The circuit board 70 could be a liquid crystal panel, by way of example. The semiconductor device 72 is formed by punching out the base substrate 10 of the tape-shaped semiconductor device around the outline that encompasses the semiconductor chip 60.

The base substrate 10 of the semiconductor device 72 could also be provided with bends, as shown in FIG. 5. For example, the base substrate 10 could be made to bend around an end portion of the circuit board 70. When the base substrate 10 is to be bent, it is preferable to have the slits 16 at the bend portions of the base substrate 10. This facilitates the bending of the base substrate 10.

Electronic Equipment

Figure 6:
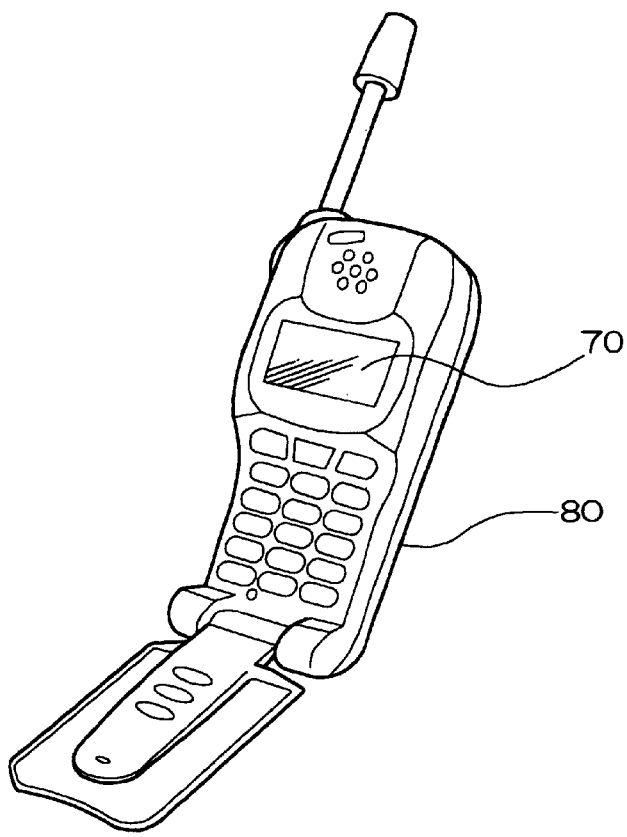
FIG. 6 shows electronic equipment in accordance with an embodiment to which the present invention is applied.
Figure 7:
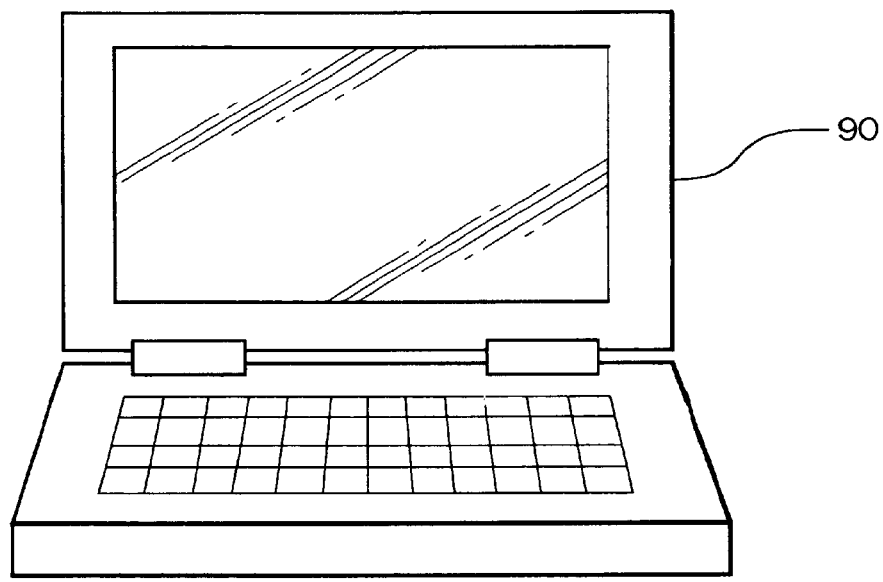
FIG. 7 shows electronic equipment that has a semiconductor device in accordance with an embodiment to which the present invention is applied.

A portable telephone 80 is shown in FIG. 6 as an example of electronic equipment having a semiconductor device to which the present invention is applied. This portable telephone 80 has the circuit board 70 (liquid crystal panel) to which the present invention is applied. A notebook-sized personal computer 90 having a semiconductor device (not shown in the figure) to which the present invention is applied is shown in FIG. 7.

The present invention is not limited to the above-described embodiment, and thus it can be various in different ways. For example, a flexible interconnecting substrate in accordance with a variation of the above embodiment of the present invention is shown in FIG. 9.

Figure 8:
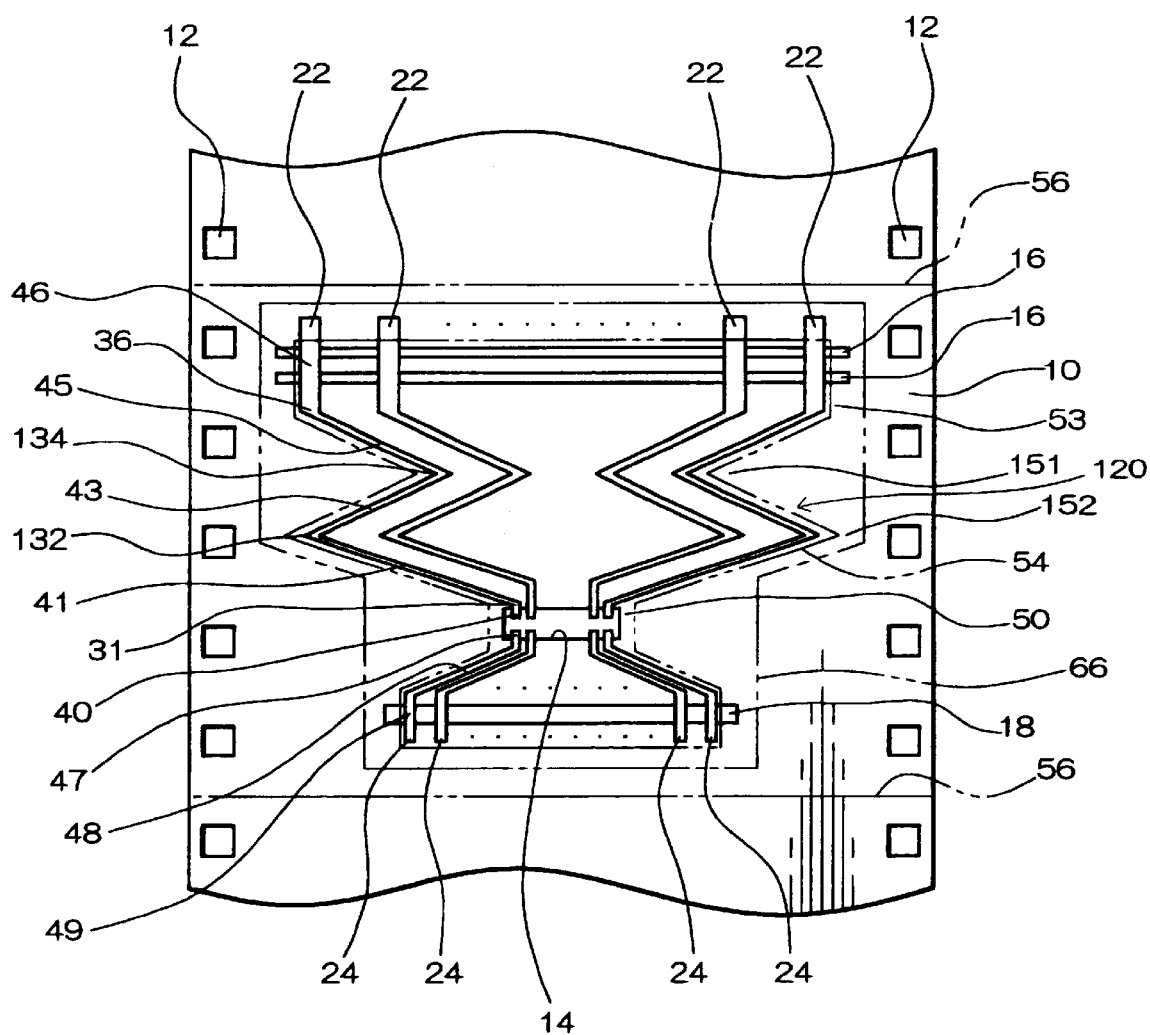
FIG. 8 shows a flexible interconnecting substrate in accordance with an embodiment to which the present invention is applied.

The flexible interconnecting substrate of FIG. 8 has an interconnecting pattern 120 that is a variation of the interconnecting pattern 20 of the flexible interconnecting substrate of FIG. 1. The interconnecting pattern 120 has a direction-changing portion 132 that combines the direction-changing portions 32 and 33 of FIG. 1, omitting the linear portions 42 of the interconnecting pattern 20, and a direction-changing portion 134 that combines the direction-changing portions 34 and 35 of FIG. 1, omitting the linear portions 44 of the interconnecting pattern 20. The position of the direction-changing portion 132 is at a widthwise maximum at a wide portion 152 and the position of the direction-changing portion 134 is at a widthwise minimum at a narrow portion 151.

In this variation, the linear portions 42 and 44 are omitted at both the wide portion 152 and the narrow portion 151, but the configuration could also be such that either the wide portion 152 or the narrow portion 151 has the linear portions 42 or 44, and the other of the wide portion 152 or the narrow portion 151 does not have the linear portions 42 or 44. Other structural details and effects of operation are similar to those of the previously described embodiments.

Figure 9:
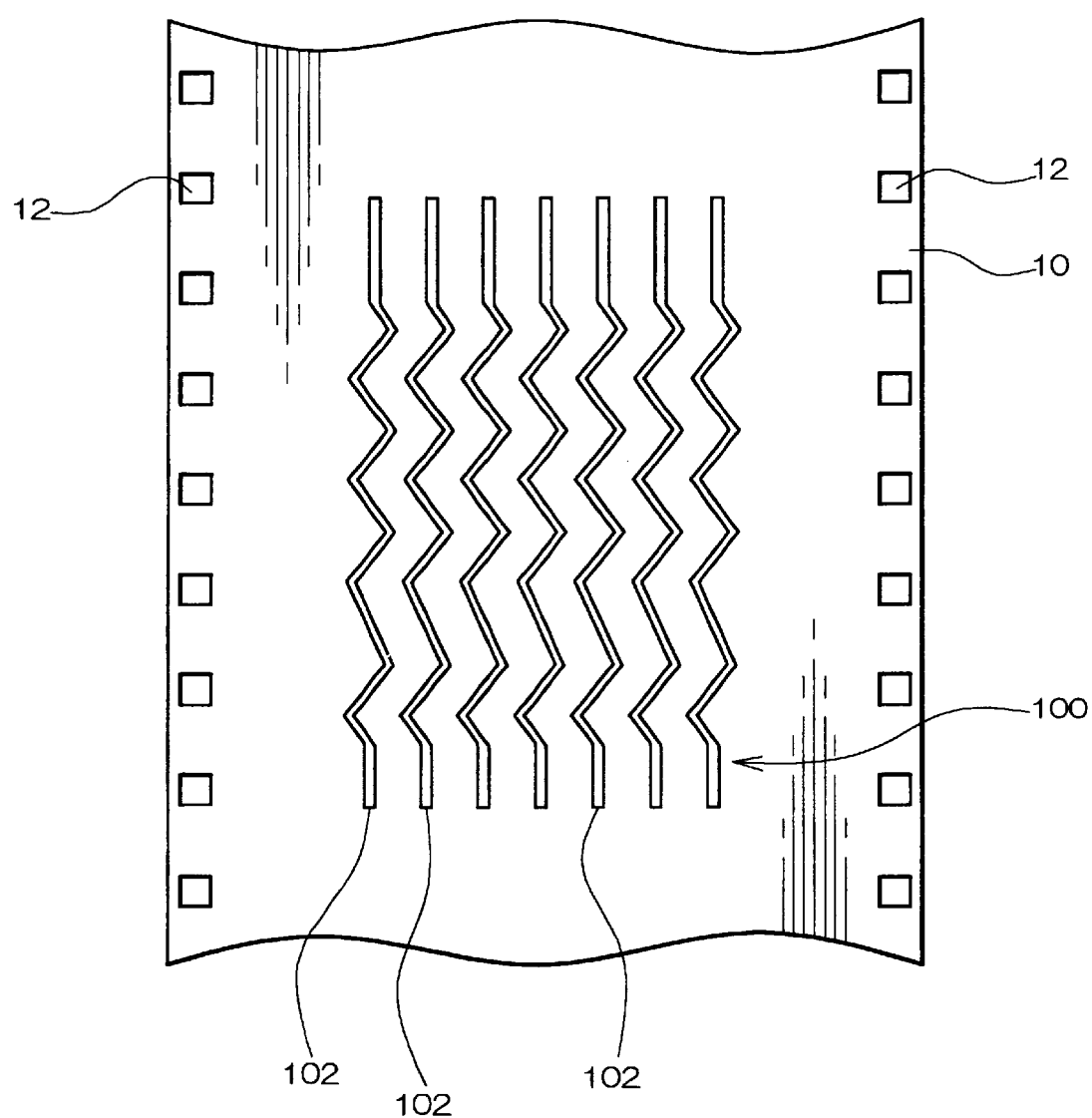
FIG. 9 shows a flexible interconnecting substrate that is a variant of this embodiment of the invention.

The flexible interconnecting substrate of FIG. 9 comprises the above-described base substrate 10 and a plurality of interconnecting patterns 100. Note that only one interconnecting pattern 100 is shown in FIG. 9. Each interconnecting pattern 100 has a plurality of interconnects 102. Each interconnect 102 is formed to bend repeatedly to the left and right from the longitudinal axis of the base substrate 10. In this configuration too, each interconnect 102 has a portion that extends to the right and a portion that extends to the left, from the longitudinal axis of the base substrate 10. It is therefore possible to achieve effects similar to those of the previously described embodiments.

Details of the method of fabricating a flexible interconnecting substrate in accordance with these variations can be as described above with respect to the previous embodiments. This flexible interconnecting substrate can also be used to fabrication a film carrier, a tape-shaped semiconductor device, a semiconductor device, a circuit board, and electronic equipment.

Note that the "semiconductor chip" that is a structural component of the present invention as described above could be replaced by an "electronic element", and electronic elements (either active elements or passive elements) can be mounted on a flexible interconnecting substrate or film carrier to fabrication an electronic component, in a manner similar to that of a semiconductor element. Examples of electronic components fabricated by using such electronic elements include, optical elements, resistors, capacitors, coils, oscillators, filters, temperature sensors, thermistors, varistors, variable resistors, or fuses, by way of example.

EXAMPLES

The description now turns to examples where the previously described embodiments are particularly limited to film carrier tape.

This film carrier tape is a film carrier tape wherein the interconnecting pattern 20 is formed on a flexible substrate (the base substrate 10), and which is characterized in being provided alternately with the wide portions 52 and 53, which expand the width of the region of the interconnecting pattern 20 along the direction of extension of the interconnecting pattern 20, and the narrow portions 50 and 51, which contract the width of the region of the interconnecting pattern 20. Since the interconnecting pattern 20 in accordance with the above described film carrier, tape is such that the interconnecting pattern 20 shifts obliquely with respect to the direction of extension of the interconnecting pattern 20 in the transitions from the wide portions 52 and 53 to the narrow portions 50 and 51 (or vice versa), this makes it possible to increase the strength of the copper foil that configures the interconnecting pattern 20, even in directions other than the direction of extension of the interconnecting pattern 20, and also increase the bending strength of the film carrier tape itself. This means that the film carrier tape itself provides, support even if a force that would cause warping is applied to the film carrier tape, thus making it possible to prevent the generation of warping. In addition, it is possible that warping will occur in the film carrier tape due to differences in the coefficient of thermal expansion between the copper foil and the substrate (the base substrate 10), but the interconnecting pattern 20 shifts obliquely with respect to the direction of extension of the interconnecting pattern 20, thus traversing the direction of the warping as described above. Since the forces that generate warping therefore interfere with each other, these forces are restrained and it is possible to further reduce the amount of warping generated in the film carrier tape.

The film carrier tape is a film carrier tape wherein an interconnecting pattern 20 is formed on top of a flexible substrate (the base substrate 10), which is characterized in being provided with a plurality of direction-changing portions 31 to 36 at which the direction of the interconnecting pattern 20 changes midway along the direction of extension of the interconnecting pattern 20. With the above-described film carrier tape, the interconnecting pattern 20 is formed in a zigzag along the direction of extension of the interconnecting pattern 20. Thus the strength of the copper foil that forms the interconnecting pattern 20 can be improved in directions other than the direction of extension of the interconnecting pattern 20, which also improves the bending strength of the film carrier tape itself. By improving the bending strength in this manner, the interconnecting pattern 20 provides support even if a force that would cause the generation of warping is applied to the film carrier tape, making it possible to prevent the generation of warping in the film carrier tape. In addition, it is possible that warping will occur in the film carrier tape due to differences in the coefficient of thermal expansion between the copper foil and the substrate (the base substrate 10), but the interconnecting pattern 20 is in a form similar to a zigzag with respect to the direction of extension of the interconnecting pattern 20, so that it alternately traverses the direction of warping. Since the forces that generate warping therefore interfere with each other, these forces are restrained and it is possible to further reduce the amount of warping generated in the film carrier tape.

The film carrier tape has the interconnecting pattern 20 formed on top of a flexible substrate (the base substrate 10), is also provided with input terminals and output terminals that are connected to the interconnecting pattern 20 on either side of the substrate (the base substrate 10) positioned in the direction of extension of the interconnecting pattern 20, and is provided with a device hole protruding from one end of the interconnecting pattern 20 between the input terminals and the output terminals. It is further characterized in being provided alternately with the wide portions 52 and 53, which expand the width of the region of the interconnecting pattern 20 in the direction of extension of the interconnecting pattern 20 between the input terminals and the output terminals, and the narrow portions 50 and 51 which narrow the width of the region of the interconnecting pattern 20. Since this configuration of the film carrier tape is provided with input terminals and output terminals on either side of the device hole 14 in the direction of extension of the interconnecting pattern 20, a large proportion of the interconnecting pattern 20 is interposed between the device hole 14 and the output terminals (in comparison with the proportion thereof between the device hole 14 and the input terminals). Thus, if the wide portions 52 and 53 and the narrow portions 50 and 51 are provided within this region, the amount of warping generated in the film carrier tape by the large proportion of the interconnecting pattern 20 can be effectively reduced.

The film carrier tape is characterized in that a resist layer (the protective film 54) is applied along the width of the region of the interconnecting pattern 20. With the above described film carrier tape, the region over which the resist (the protective film 54) is applied can be reduced. It is therefore possible to restrain the amount of thermal contraction of the resist (the protective film 54), even when the film carrier tape is subjected to a heating step, making it possible to reduce the amount of warping of the film carrier tape.

The film carrier tape has the interconnecting pattern 20 and a resist (the protective film 54) for protecting this interconnecting pattern 20, formed on top of a flexible substrate (the base substrate 10). It is further characterized in that the region over which the resist (the protective film 54) is applied is set to be in a flat drum-shape along the direction of extension of the interconnecting pattern 20 and also the region of the interconnecting pattern 20 is formed in such a manner that it fits into the region over which the resist (the protective film 54) is applied. With the film carrier tape as described above, the region over which the resist (the protective film 54) is applied can be reduced by a portion caused by the difference of the maximum width and minimum width of the region over which the resist (the protective film 54) is applied. It is therefore possible to restrain the amount of thermal contraction of the resist (the protective film 54), even when the film carrier tape is subjected to a heating step, making it possible to reduce the amount of warping of the film carrier tape. In addition to the above described operation, the copper foil in the interconnecting pattern 20 provides support in directions other than the direction of extension of the interconnecting pattern 20, making it possible to guarantee the rigidity of the film carrier tape overall. It is therefore possible to prevent the generation of warping in the film carrier tape by the rigidity of the copper foil, even if a force that would cause warping is applied to the film carrier tape. It is also possible that warping will occur in the film carrier tape due to differences in the coefficient of thermal expansion between the copper foil and the substrate (the base substrate 10) but, since the interconnecting pattern 20 is formed so as to fit within the region of the resist (the protective film 54), the interconnecting pattern 20 shifts obliquely and traverses the direction of warping. Since the forces that generate warping therefore interfere with each other, these forces are restrained and it is possible to further reduce the amount of warping generated in the film carrier tape.

The film carrier tape is further characterized in that the direction of extension of the interconnecting pattern 20 matches the longitudinal direction of the elongate tape out of which film carrier tapes are formed sequentially. With the film carrier tape as described above, film carrier tapes are formed sequentially in the longitudinal direction of the elongate tape (the base substrate 10). Therefore, if the direction of extension of the interconnecting pattern is made to match the longitudinal direction of the elongate tape (the base substrate 10), the elongate tape (the base substrate 10) will swell due to warping of the sequence of film carrier tapes, leading to warping that looks similar to rain-gutter. However, since the interconnecting pattern 20 shifts obliquely with respect to the direction of extension of the interconnecting pattern 20, it is possible to improve the bending strength and interfere with the forces that cause warping, so that the amount of warping generated in the film carrier tape (elongate tape) can be reduced.

The semiconductor device is characterized in being provided with a film carrier tape and a semiconductor chip. With this semiconductor device, the use of the above described film carrier tape makes it possible to reduce the warping generated in the semiconductor device to a level at which it is no problem.

FIG. 1 illustrates a state in which a film carrier tape is formed on an elongate tape. As shown in this figure, the base substrate (elongate tape) 10 is a tape of a polyimide provided with sprocket holes which are formed on both edges thereof and which engage with sprockets (not shown in the figure), making it possible to convey the base substrate (elongate tape) 10 itself in the longitudinal direction thereof.

Incidentally, with this base substrate (elongate tape) 10, the interconnecting patterns 20 are formed in a central portion thereof. To form such a film carrier tape, the semiconductor chip 60 is mounted in the device hole 14, as described later, then, after the film carrier tape has been connected electrically to the semiconductor chip 60, the film carrier tape is punched out by a die (not shown in the figure) along the outline encompassed by the broken line 66 in the figure.

The rectangular device hole 14 within the film carrier tape is provided in a direction such that the longitudinal direction thereof traverses the direction of extension of the base substrate (elongate tape) 10. The size of the device hole 14 is formed to, be just sufficient to accommodate the semiconductor chip therein, with the configuration being such that the film carrier tape and the semiconductor chip are connected electrically by crimping connection terminals that are provided on the semiconductor chip onto inner leads protruding inward from the edges of the device hole 14.

Input terminals (the linear portions 49) and output terminals (the linear portions 46) that enable input and output to and from the semiconductor chip are provided at locations that are separated in parallel in the longitudinal direction of the base substrate (elongate tape) 10 from the long edges of the device hole 14, in other words, at end portions of the film carrier tape in the longitudinal direction of the base substrate (elongate tape) 10. Note that the outer lead hole 18 is provided in the substrate (polyimide) at the portion at which the input terminals are formed and the input terminals are formed to straddle this outer lead hole 18.

Slits (bending holes) 16 are provided in the film carrier tape to allow bending along the substrate (not shown in the figure), between one long edge of the device hole 14 and the output terminals, and they can also be used to ensure positioning when the film carrier tape is bent.

A large number of interconnects 22, which are designed to provide electrical conductivity between the above described input terminals (the linear portions 49) and the long edge and between the long edge and the output terminals (the linear portions 46), are formed, to configure the interconnecting pattern 20. The protective film 54 of a material such as resist is provided to cover this interconnecting pattern 20. The wide portions 52 and 53, which expand the width of the region of the interconnecting pattern 20, and the narrow portions 50 and 51, which contract the width of the region of the interconnecting pattern 20, are provided alternately from the long edge of the device hole 14 to the output terminals (the linear portions 46), with the configuration being such that the interconnecting pattern 20 shifts obliquely with respect to the direction of extension of the interconnecting pattern 20 to match the longitudinal direction of the base substrate (elongate tape) 10.

Cross-sectional comparison views of the wide portion 52 and the narrow portion 51 are shown in FIG. 2. As shown in this figure, in both the wide portion 52 and the narrow portion 51, a plurality of interconnects 22 are formed on an upper surface of the base substrate (elongate tape) 10, with the adhesive 26 therebetween, and the protective film 54 is applied thereover to protect the interconnects 22. Thus the same structure is used for the wide portion 52 and the narrow portion 51. However, the widths of the wide portion 52 and the narrow portion 51 are formed to be different by narrowing the widths of the interconnects 22 and the pitch between neighboring interconnects 22.

The description now turns to a state in which the film carrier tape of the above configuration has been subjected to thermal stresses in a heating step. Since each of the interconnects 22 has the direction-changing portions 34 and 35 in the narrow portion 51, the interconnects 22 shift obliquely with respect to the direction of extension of the interconnecting pattern 20. It is therefore possible for the copper foil that makes up the interconnecting pattern 20 to improve the bending strengths in each of the A direction, B direction, and C direction shown within the figure (ensure the bending strength, regardless of the bending direction), the interconnecting pattern 20 provides support against external forces, even when an external force that causes warping is applied to the film carrier tape, making it possible to prevent the generation of warping.

If a film carrier tape of a prior-art example is subjected to heating in a heating step, since the coefficient of thermal expansion of the copper foil that forms the interconnecting pattern 20 is less than the coefficient of thermal expansion of the elongate tape made of a polyimide, the elongation ratio on the rear surface side of the elongate will increase (the upper surface being regulated by the expansion of the copper foil), so that warping will occur in the film carrier tape. However, in the film carrier tape of the present invention the A direction, B direction, and C direction shown in FIG. 3 differ from the direction of the interconnecting pattern 20, so that any warping that does occur in the A direction, B direction, and C direction will cancel mutually, thus making it possible to restrain any further warping.

Note that there is considerable contraction of the protective film 54 during cooling. The amount of warping in the film carrier tape due to this contraction of the protective film 54 will increase, so it is preferable to restrict the area of the film carrier tape over which the protective film 54 is applied. In this film carrier tape, the region over which the protective film 54 is applied is set to be an area sufficient to just cover the region in which the interconnecting pattern 20 is formed. Thus portions where the formation region of the interconnecting pattern 20 is small, such as at the narrow portions 50 and 51, have a smaller area covered by the protective film 54, making it possible to reduce the amount of warping with respect to the film carrier tape.

Note that the above description related to a state in which the narrow portions 50 and 51 were provided between the wide portions 52 and 53, but this state is not particularly limiting and thus any number of wide portions 52 and 53 and narrow portions 50 and 51 could equally well be formed alternately with respect to the direction of extension of the interconnecting pattern 20.

What is claimed is:

1. A flexible interconnecting substrate comprising a tape-shaped base substrate and a plurality of interconnecting patterns formed on said base substrate, wherein:

each of said interconnecting patterns has a plurality of interconnects, at least one of the interconnects includes ends that are separated along a longitudinal direction of the base substrate, and each of the interconnects has a first portion that progresses along the longitudinal direction and shifts obliquely with respect to a longitudinal axis of said base substrate and toward the longitudinal axis, and a second portion that progresses along the longitudinal direction and shifts obliquely with respect to the longitudinal axis and away from the longitudinal axis.

2. The flexible interconnecting substrate as defined in claim 1, wherein each of said interconnecting patterns has a plurality of interconnect portions aligned along an extending direction of said interconnecting patterns, said interconnecting portions comprising regions of plurality types of width being disposed on said base substrate.

3. The flexible interconnecting substrate as defined in claim 1, wherein each of said interconnecting patterns has a plurality of interconnect portions aligned along a longitudinal direction of said base substrate, said interconnecting portions comprising regions of plurality types of width being disposed on said base substrate.

4. The flexible interconnecting substrate as defined in claim 3, wherein:

one of said interconnect portions is a wide portion that expands the width of a region disposed on said base substrate, and another of said interconnect portions is a narrow portion that narrows the width of the region disposed on said base substrate.

5. The flexible interconnecting substrate as defined in claim 4, wherein:

said wide portion is a maximum of the width of the region disposed on said base substrate, and said narrow portion makes the width of the region disposed on said base substrate narrower than the width of said wide portion.

6. The flexible interconnecting substrate as defined in claim 4, wherein said narrow portion has a plurality of direction-changing portions for changing the direction of each of said interconnecting patterns.

7. The flexible interconnecting substrate as defined in claim 4, wherein the width of a portion of each of the interconnects positioned at said wide portion is wider than the width of a portion thereof positioned at said narrow portion.

8. The flexible interconnecting substrate as defined in claim 4, wherein a pitch of the interconnects adjoining each other at said wide portions is wider than the pitch thereof at said narrow portions.

9. The flexible interconnecting substrate as defined in claim 4, wherein a slit is formed in said base substrate so as to extend in the widthwise direction thereof.

10. The flexible interconnecting substrate as defined in claim 9, wherein said slit is formed in a region where said wide portion is formed.

11. The flexible interconnecting substrate as defined in claim 4, wherein each of said interconnecting patterns has an electrically connecting portion to a semiconductor chip, and formed in regions extending in a plurality of directions from said electrically connecting portion, said narrow portion and said wide portion being formed in at least one of the regions.

12. The flexible interconnecting substrate as defined in claim 11, wherein:

each of said interconnecting patterns has a first terminal for external connection that is formed in a region extending in one direction from said electrically connecting portion and a second terminal for external connection that is formed in a region extending in another direction from said electrically connecting portion, and said narrow portion and said wide portion are formed between said electrically connecting portion and at least one of said first and second terminals.

13. The flexible interconnecting substrate as defined in claim 11, wherein:

a plurality of device holes are formed in said base substrate, and said electrically connecting portion comprises a plurality of leads protruding into each of said device holes.

14. The flexible interconnecting substrate as defined in claim 4, comprising a protective film covering said interconnecting patterns, wherein the width of said protective film in the widthwise direction of said base substrate is formed to be wider in a region covering said wide portion and narrower in a region covering said narrow portion.

15. The flexible interconnecting substrate as defined in claim 1, wherein each of said interconnects extends by repeating a reciprocal bending to the left and the right.

16. A film carrier obtained by cutting said base substrate of the flexible interconnecting substrate as defined in claim 1, at lines extending in the widthwise direction of said base substrate.

17. A tape-shaped semiconductor device comprising:

the flexible interconnecting substrate as defined in claim 1; and a plurality of semiconductor chips connected electrically to said interconnecting patterns of said flexible interconnecting substrate.

18. A semiconductor device obtained by cutting said base substrate of the tape-shaped semiconductor device as defined in claim 17, at lines extending in the widthwise direction, on both sides of one of said semiconductor chips.

19. A circuit board connected electrically to the semiconductor device as defined in claim 18.

20. The circuit board as defined in claim 19,
wherein said base substrate of said semiconductor device is provided so as to bend around an edge of said circuit board.

21. The circuit board as defined in claim 20, wherein:
said base substrate of said semiconductor device is provided with a slit, said slit being formed in said base substrate so as to extend in the widthwise direction thereof,
said slit of said base substrate is disposed at said edge of said circuit board, and
a portion of said base substrate forming said slit bends.

22. The circuit board as defined in claim 19,
wherein said circuit board is formed as a liquid crystal panel.

23. A semiconductor device obtained by punching-out said base substrate of the tape-shaped semiconductor device as defined in claim 17, around an outline that encompasses one of said semiconductor chips.

24. Electronic equipment having the semiconductor device as defined in claim 18.

25. The flexible interconnecting substrate as defined in claim 1,
wherein at least one of the interconnecting patterns is symmetrical about the longitudinal axis of the base substrate.

26. The flexible interconnecting substrate as defined in claim 1,
wherein at least one of the interconnecting patterns include only linear portions extending left or right between linear portions at its ends, forming a zigzag pattern.

27. The flexible interconnecting substrate as defined in claim 1, the interconnecting patterns including an interconnect having linear portions extending in the longitudinal direction disposed on both sides of a longitudinal axis of the interconnect.

28. A method of manufacturing a flexible interconnecting substrate comprising a step of forming a plurality of interconnecting patterns on a base substrate of an elongate form, wherein:
each of said interconnecting patterns has a plurality of interconnects, at least one of the interconnects includes ends that are separated along a longitudinal direction of the base substrate, and
a first portion of each of the interconnects is formed to progress along the longitudinal direction and shift obliquely with respect to a longitudinal axis of said base substrate and toward the longitudinal axis and a second portion of each of the interconnects is formed to progress along the longitudinal direction and shift obliquely with respect to the longitudinal axis and away from the longitudinal axis.

* * * * *